(12) United States Patent
Leung

(10) Patent No.: US 7,533,222 B2
(45) Date of Patent: May 12, 2009

(54) DUAL-PORT SRAM MEMORY USING SINGLE-PORT MEMORY CELL

(75) Inventor: Wingyu Leung, Cupertino, CA (US)

(73) Assignee: MoSys, Inc., Sunnyvale, CA (US)

( * ) Notice: Subject to any disclaimer, the term of this patent is extended or adjusted under 35 U.S.C. 154(b) by 481 days.

(21) Appl. No.: 11/427,785

(22) Filed: Jun. 29, 2006

(65) Prior Publication Data

US 2008/0005492 A1      Jan. 3, 2008

(51) Int. Cl.
*G06F 13/00* (2006.01)
(52) U.S. Cl. .......................... 711/149; 711/150
(58) Field of Classification Search ................. 711/149, 711/150, 105, 106; 365/230.05, 222
See application file for complete search history.

(56) References Cited

U.S. PATENT DOCUMENTS

| | | | |
|---|---|---|---|
| 5,197,035 A | 3/1993 | Ito | |
| 5,923,593 A | 7/1999 | Hsu et al. | |
| 6,028,804 A | 2/2000 | Leung | |
| 6,070,256 A | 5/2000 | Wu et al. | |
| 6,075,720 A | 6/2000 | Leung et al. | |
| 6,212,607 B1 * | 4/2001 | Miller et al. | 711/149 |
| 6,222,785 B1 | 4/2001 | Leung | |
| 6,504,780 B2 | 1/2003 | Leung | |
| 7,237,071 B2 * | 6/2007 | Jahnke | 711/150 |
| 2002/0056030 A1 * | 5/2002 | Kelly et al. | 711/150 |
| 2002/0146025 A1 | 10/2002 | Okina | |
| 2003/0067830 A1 | 4/2003 | Leung et al. | |
| 2003/0135699 A1 | 7/2003 | Matsuzaki et al. | |
| 2005/0005069 A1 | 1/2005 | Au et al. | |

OTHER PUBLICATIONS

"Digital Logic MetaStability and Flip Flop MTBF Calculation", http://www.interfacebus.com/Design_MetaStable.html, 8 pages.
Veendrick, Harry J. M. "The Behavior of Flip-Flops Used as Synchronizers and Prediction of Their Failure Rate", IEEE Journal of Solid-State Circuits, vol. SC-15, No. 2, Apr. 1980, pp. 169-176.

* cited by examiner

*Primary Examiner*—Vu A Le
(74) *Attorney, Agent, or Firm*—Bever, Hoffman & Harms, LLP; E. Eric Hoffman

(57) ABSTRACT

A dual-port memory system is implemented using single-port memory cells. An access arbiter having a synchronization circuit is used to prioritize and synchronize the access requests associated with the two ports. The access arbiter can also prioritize and synchronize refresh requests, in the case where the single-port memory cells require refresh. Access requests on the two ports and the refresh requests can be asynchronous. The access arbiter synchronizes the various requests by latching the requests into first-stage registers when a row access signal (RAS) is activated, and subsequently latching the contents of the first-stage registers into second-stage registers after a selected delay.

21 Claims, 7 Drawing Sheets

DUAL-PORT SRAM MEMORY USING SINGLE-PORT MEMORY CELL

FIELD OF THE INVENTION

The present invention relates to semiconductor memory systems, such as static random access memory (SRAM) systems or dynamic random access memory (DRAM) systems. In particular, the present invention relates to a method and apparatus of implementing a dual-port memory using a single-port memory cell. In addition, the present invention relates to dual-port memories in which accesses on the two ports can be asynchronous to each other.

DISCUSSION OF RELATED ART

In the past, dual-port semiconductor memories have been implemented with conventional dual-port memory cells, such as dual-port static random access memory (SRAM) cells and dual-port dynamic random access memory (DRAM) cells.

FIG. 1 is a circuit diagram illustrating a conventional dual-port SRAM cell 100. Dual-port SRAM cell 100 includes eight transistors 101-108, and requires two word lines $WL_{P1}$-$WL_{P2}$ and four bit lines $BL_{P1}$, $BL_{P1}\#$, $BL_{P2}$ and $BL_{P2}\#$. The first port of SRAM cell 100 (port 1) is accessed via word line $WL_{P1}$ and bit lines $BL_{P1}$-$BL_{P1}\#$. The second port of SRAM cell 100 (port 2) is accessed via word line $WL_{P2}$ and bit lines $BL_{P2}$-$BL_{P2}\#$.

FIG. 2 is a circuit diagram illustrating a conventional dual-port DRAM cell 200. Dual-port DRAM cell 200 includes two transistors 201-202 and a capacitor 203, and requires two word lines $WL_1$-$WL_1$ and two bit lines $BL_1$-$BL_1$. The first port of DRAM cell 200 is accessed via word line $WL_1$ and bit line $BL_1$. The second port of DRAM cell 200 is accessed via word line $WL_1$ and bit line $BL_1$. Dual-port DRAM cell 200 is described in more detail in U.S. Pat. No. 5,923,593, entitled "Multi-port DRAM Cell and Memory System Using Same".

FIGS. 3 and 4 are circuit diagrams illustrating a conventional single-port SRAM cell 300 and a conventional single-port DRAM cell 400, respectively. Single-port SRAM cell 300 includes six transistors 301-306, and requires two bit lines BL and BL# and one word line WL. Single-port DRAM cell 400 includes one transistor 401, one capacitor 402 and requires one bit line BL and one word line WL. Because the dual-port cells 100 and 200 include significantly more circuit elements than the corresponding single-port cells 300 and 400, the dual-port cells 100 and 200 occupy significantly more layout area than the corresponding single-port cells 300 and 400.

In addition, when both ports of dual-port SRAM cell 100 (or both ports of dual-port DRAM cell 200) are accessed at the same time, intermittent data usually results. That is, when a write operation is performed on one port of a dual-port cell, and a write operation is performed on the other port of the dual-port cell, the write and read operations may interfere with one another. In these cases, erroneous (or indefinite) data can be read from or written to the dual-port cell. Note that the intermittent data issue does not exist in single-port cells, such as SRAM cell 300 and DRAM cell 400.

It would be desirable to be able to use single-port cells to perform a dual-port function, thereby minimizing cell layout area and eliminating intermittent data.

SUMMARY

Accordingly, the present invention provides a dual-port memory system implemented using single-port memory cells. More specifically, the present invention includes an array of single-port memory cells, which may be, for example, SRAM or DRAM cells. A first set of registers store data, address and control values associated with a first port, and a second set of registers store data, address and control values associated with a second port. An access arbiter is configured to receive first and second port enable signals associated with the first and second ports, respectively. If the single-port memory cells require refresh, then the access arbiter also receives a refresh request signal.

The access arbiter includes circuitry for activating a memory request signal when one or more of the first port enable signal, the second port enable signal or the refresh request signal is activated. The activated memory request signal causes a memory sequencer to sequentially activate and de-activate the control signals necessary to access the memory array. In one embodiment, one of these control signals is a row access signal (RAS).

The access arbiter also includes a synchronization circuit having a first stage and a second stage. The first and second port enable signals and the refresh request signal are all latched into the first stage of the synchronization circuit in response to the row access signal. A delay circuit introduces a delay T to the row access signal, thereby creating a delayed row access signal. The contents of the first stage of the synchronization circuit are latched into the second stage of the synchronization circuit in response to the delayed row access signal. The delay T is selected to control the expected mean-time-before-failure.

The contents of the second stage of the synchronization circuit are provided to a prioritization circuit, which generates a first select signal associated with the first port, a second select signal associated with the second port, and a third select signal associated with the refresh request. The prioritization circuit ensures that only the highest priority signal of the first, second and third select signals is activated at any given time. When activated, the first, second and third select signals enable an access on the first port, an access on the second port and a refresh access, respectively.

The first, second and third select signals are used in combination with the row access signal to de-activate the memory request signal.

In accordance with one embodiment, one of the port enable signals is activated and processed while a clock signal has a first logic state. The refresh request signal can then be activated and processed while the clock signal has a second logic state. This embodiment is useful for implementing a display buffer.

The present invention will be more fully understood in view of the following description and drawings.

DETAILED DESCRIPTION

Figure 1:
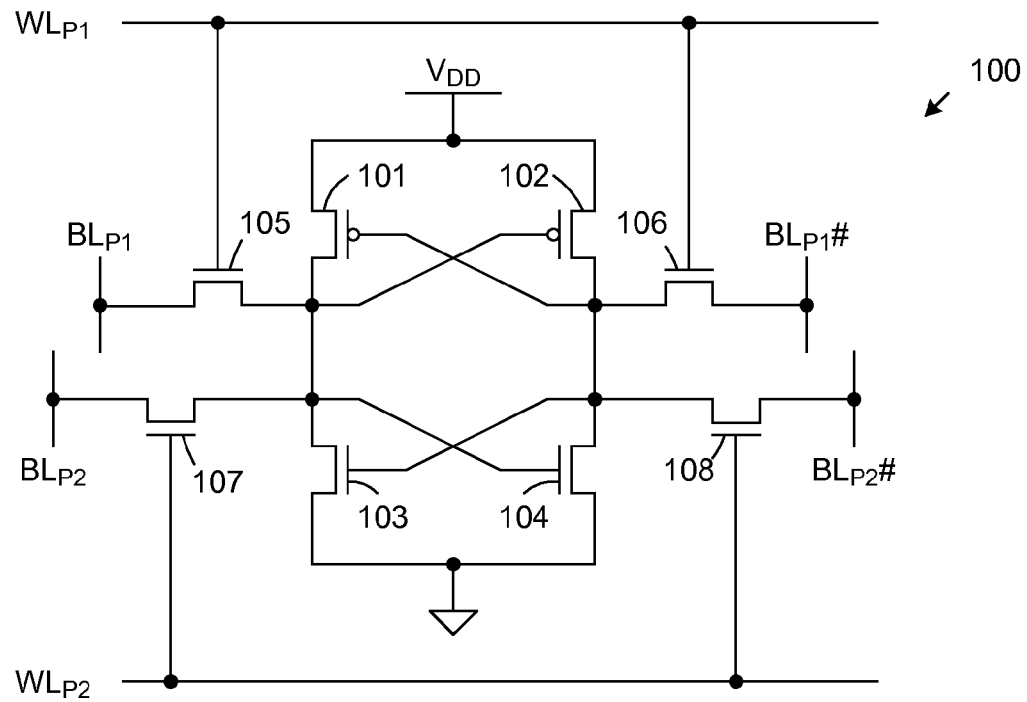
FIG. 1 is a circuit diagram of a conventional dual-port SRAM cell.
Figure 2:
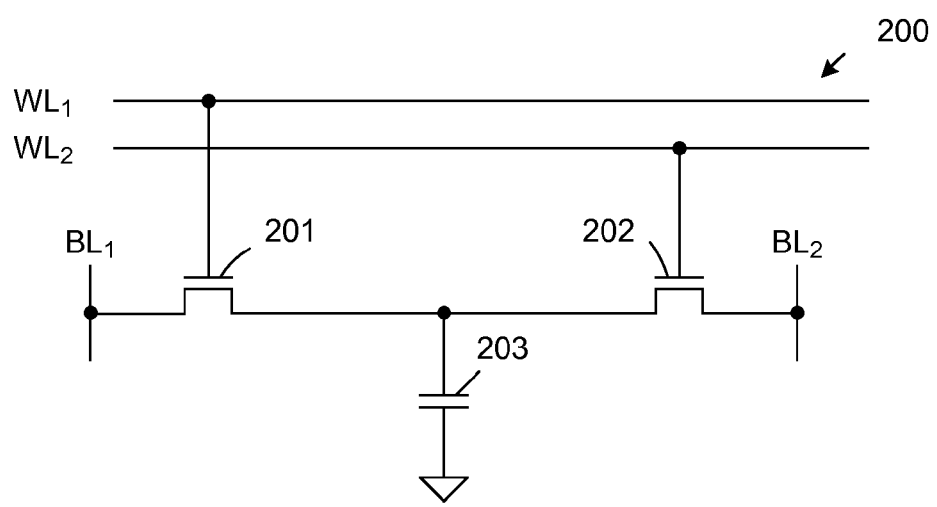
FIG. 2 is a circuit diagram of a conventional dual-port DRAM cell.
Figure 3:
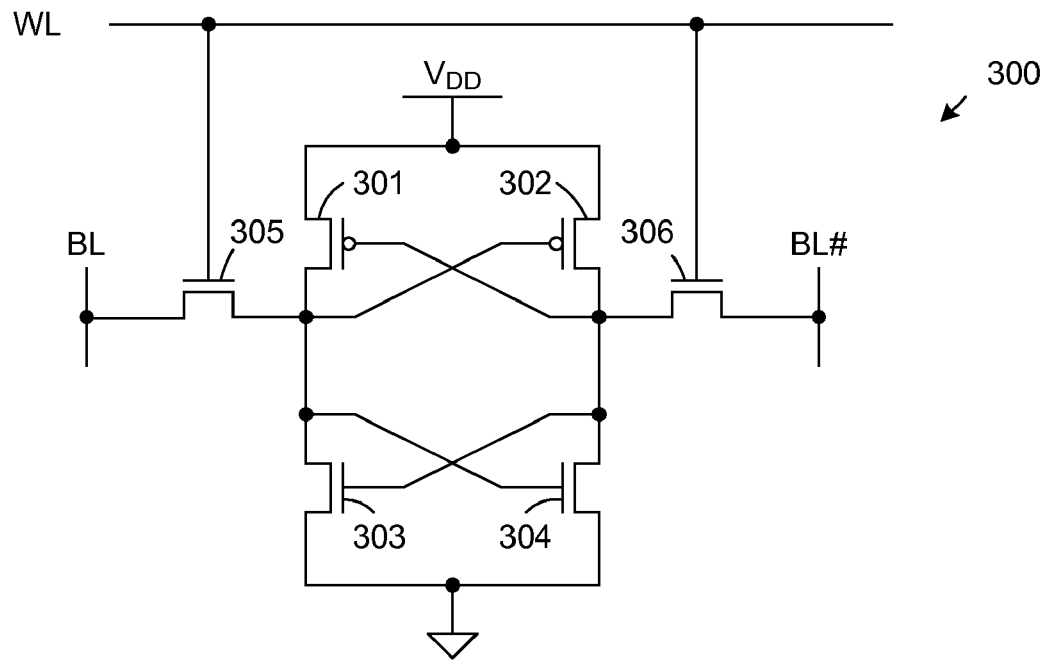
FIG. 3 is a circuit diagram of a conventional single-port SRAM cell.
Figure 4:
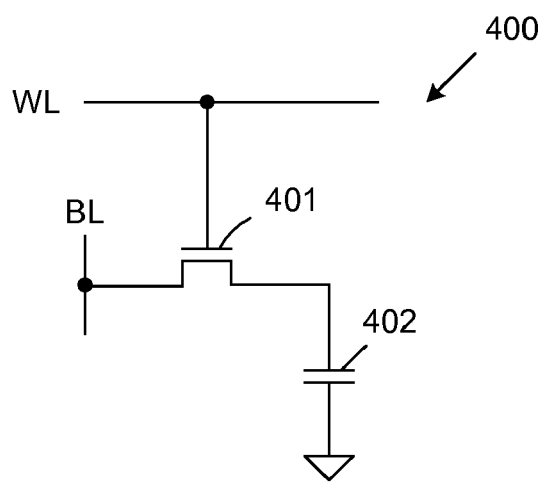
FIG. 4 is a circuit diagram of a conventional single-port DRAM cell.

The embodiments described herein are provided for illustrative purposes only and are not meant to serve as limits to the present invention. In a first embodiment, both ports are accessed with no continuous running clock. In a second embodiment, one port has an access interface with a continuous running clock, but the other port does not. The memory of the second embodiment is particularly useful as a display buffer, wherein the memory stores display data for an LCD panel or display monitor. The display buffer has a first (display) port from which the display data is read in regular fashion to refresh the display screen. This display port is usually synchronous with a continuous running pixel clock or row display clock. The display buffer may also have a second (screen update) port to allow memory accesses by a graphics controller or a processing unit (which puts new display data in the display buffer for screen update). The screen update port usually works without a continuous running clock signal. Rather, a memory access signal is used to access the screen update port. The activated memory access signal indicates the beginning of an external memory access.

In the dual-port memory systems described below, single-port Dynamic Random Accessible Memory (DRAM) cells are used implement a dual-port memory, wherein the refreshing of the DRAM cells is completely hidden (such that the memory behaves like a dual-port SRAM). Memory accesses from the two ports can be synchronous or asynchronous with respect to each other. Memory accesses from the two ports are scheduled according to their order of arrival, wherein the earlier arriving memory requests are served first. When both ports receive access requests at substantially the same time, an access arbiter determines which access is processed first. The access arbiter also arbitrates refresh access requests.

Each port includes a transaction buffer, which stores the access information (e.g., address, data, read-write indicator and byte-write indicator) of a transaction that is pending while the memory is busy serving another transaction or refresh. Because the memory array handles only one access at a time, simultaneous accesses from the two ports to the same memory location does not cause the memory content or the read data to be corrupted. However, the memory can be overrun if the access frequency of the two ports together with refresh exceeds the maximum operating frequency of the memory array. To avoid the memory overrun situation the memory array is designed so that it can operate at frequencies equal to or greater than the sum of the maximum access frequencies of the two ports and internal refreshes.

A refresh controller similar to the one described in U.S. Pat. No. 6,504,780B2, "Method and Apparatus For Completely Hiding Refresh Operations In A DRAM Device Using Clock Division" can be incorporated to generate refresh accesses periodically to refresh the memory contents. In one embodiment, the clock to the refresh controller is generated inside the memory using a ring oscillator or a bi-stable vibrator. Such circuit is well known in the art and is not described further in this patent application. In this case, the refresh controller operation is not synchronous with either of the two ports and the two ports are not synchronous with each other. Therefore, the three memory accesses, refresh, and access from the two ports, are asynchronous with each other. In the second embodiment described below, the clock input of the refresh controller is connected to the clock signal of the display port. Therefore, the memory refresh is synchronous with the display clock.

Figure 5:
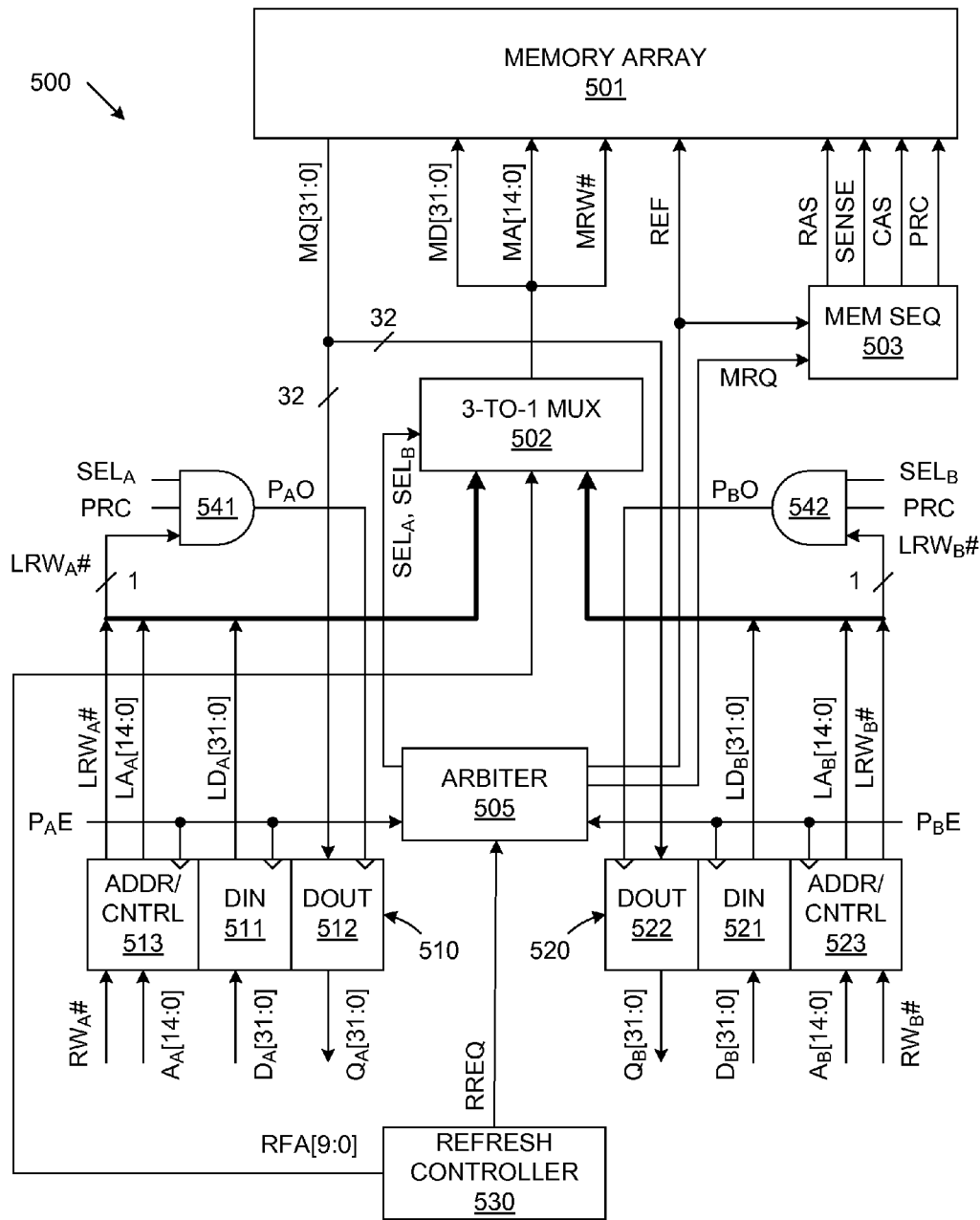
FIG. 5 is a block diagram of a dual-port memory system, which is implemented using single-port memory cells in accordance with one embodiment of the present invention.

FIG. 5 is a block diagram of a dual-port memory system 500, which is implemented using single-port memory cells in accordance with one embodiment of the present invention. As described in more detail below, refresh operations and external accesses from the two ports of memory system 500 are asynchronous with respect to one another.

Dual-port memory system 500 includes memory array 501, 3-to-1 multiplexer 502, memory sequencer 503, access arbiter 505, a first transaction buffer 510 associated with a first port (port A), a second transaction buffer 520 associated with a second port (port B), a refresh controller 530 and logical AND gates 541-542. The first transaction buffer 510 includes input data register 511, output data register 512 and address/control register 513. Similarly, the second transaction buffer 520 includes input data register 521, output data register 522 and address/control register 523. The first transaction buffer 510 stores an input data word $LD_A[31:0]$ (in input data register 511), an output data word $Q_A[31:0]$ (in output data register 512) and an access address $LA_A[14:0]$ and a read-write control signal $LRW_A\#$ (in address/control register 513). Similarly, the second transaction buffer 520 stores an input data word $LD_B[31:0]$ (in input data register 521), and an output data word $Q_B[31:0]$ (in output data register 522) and an access address $LA_B[14:0]$ and a read-write control signal $LRW_B\#$ (in address/control register 523). The first and second transaction buffers 510 and 520 store access information associated with port A and port B, respectively, in case memory system 500 is busy serving the other port.

Memory array 501 can include one or more memory banks. In the described examples, memory array 501 is implemented using ordinary DRAM cells or embedded DRAM cells, such as those described in U.S. Pat. No. 6,075,720, entitled "Memory Cell For DRAM Embedded In Logic". Memory array 501 can alternately be implemented using other volatile memory cells that require periodic refreshing. Memory array 501 can also be implemented using SRAM cells. If memory array 501 is implemented using SRAM cells, the refresh operations of the embodiments described below will not exist, and may therefore be ignored.

The memory cells of array 501 can be accessed through either of the dual memory ports A or B. In the described example, memory array 501 includes memory cells organized into 1k rows by 1k columns (although this size is not necessary to practice the present invention). In addition, memory array 501 includes sense amplifiers, word line drivers, read data amplifiers, write data drivers, and row and column address decoders. An example of such an array is described in more detail in U.S. Pat. No. 6,028,804, entitled "Method and Apparatus For 1-T SRAM Compatible Memory".

The address MA[14:0] provided to memory array 501 is driven by 3-to-1 multiplexer 502, which is controlled to select the latched port A access address $LA_A[14:0]$, the latched port B access address $LA_B[14:0]$, or the refresh address RFA[9:0] provided by refresh controller 530. Because memory array 501 is refreshed one row at a time, and memory array 501 has only 1024 rows, only the 10-bit row address MA[14:5] is required during a refresh operation.

Multiplexer 502 also passes the read-write indicator signal associated with the selected port (i.e., $LRW_A\#$ for port A or $LRW_B\#$ for port B) to memory array 501 as the read-write indicator signal MRW#. During a refresh operation (i.e., when the refresh control signal REF is activated high), the logic value of the read-write indicator signal MRW# is ignored.

Multiplexer 502 also passes the latched input data associated with the selected port (i.e., $LD_A[31:0]$ for port A or $LD_B[31:0]$ for port B) to memory array 501 as the write data value MD[31:0].

The internal operation of memory array 501 is controlled by a row access (RAS) signal, a sense amplifier enable (SENSE) signal, a column access (CAS) signal, and a precharge (PRC) signal. In general, the RAS, SENSE, CAS and PRC signals can be referred to as memory access control signals. The RAS, SENSE, CAS and PRC signals are all generated by memory sequencer 503 in response to a memory request signal (MRQ) and a refresh request signal (REF), which are generated within access arbiter 505. In one embodiment, memory sequencer 503 and the associated memory control signals RAS, SENSE, CAS and PRC can be implemented in a manner similar to that described in U.S. Pat. No. 6,222,785 B1, entitled "Method and Apparatus for Refreshing a Semiconductor Memory Using Idle Memory Cycles". In general, a memory access cycle starts with the activation of the RAS signal and ends with the deactivation of the RAS signal. Memory sequencer 503 initiates a memory access cycle each time the received memory request signal MRQ is activated to a logic high state. The memory request signal MRQ is driven by memory access arbiter 505, which arbitrates the access requests associated with ports A and B and memory refresh controller 530.

Each port interface consists of data output bus $Q_N[31:0]$, input data bus $D_N[31:0]$, input address bus $A_N[14:0]$, read-write indicator line $RW_N\#$, and port enable line $P_NE$, where the 'N' in each signal name identifies either port A or port B.

An external device (not shown) initiates an access on one of the ports by first driving the address on the address bus $A_N[14:0]$, the read write indicator $RW_N\#$ in the correct state ('0' for write and '1' for read), and in case of a write operation, the write data on the input data bus $D_N[31:0]$. Subsequently, the external device drives the port enable signal $P_NE$ to a logic high state. As a result, the address $A_N[14:0]$ and the read write indicator $RW_N\#$ are latched into the associated address/control register (i.e., 513 or 523), and in the case of a write operation, the write data $D_N[31:0]$ is latched into the associated input data register (i.e., 511 or 521).

Refresh controller 530 initiates refresh accesses within memory system 500. Refresh controller 530 periodically activates a refresh request signal RREQ to a logic high state each time a row of memory array 501 is to be refreshed. The period of the refresh request signal RREQ is selected to ensure that all memory cells of array 501 are refreshed in a timely manner (i.e., there is no loss of data). Refresh controller 530 also provides the row address RFA[9:0] of the row to be refreshed. The refresh row address RFA[9:0] is updated each time a refresh operation is performed.

Memory arbiter 505 arbitrates access requests received from port A, port B and refresh controller 530. Access to memory array 501 is granted on a first-come-first-served basis. If all three access requests arrive substantially simultaneously, then priority is given, in order, to the port A access request, the port B access request, and then the refresh request. The same priority is given if two of the three access requests arrive substantially simultaneously.

Figure 6:
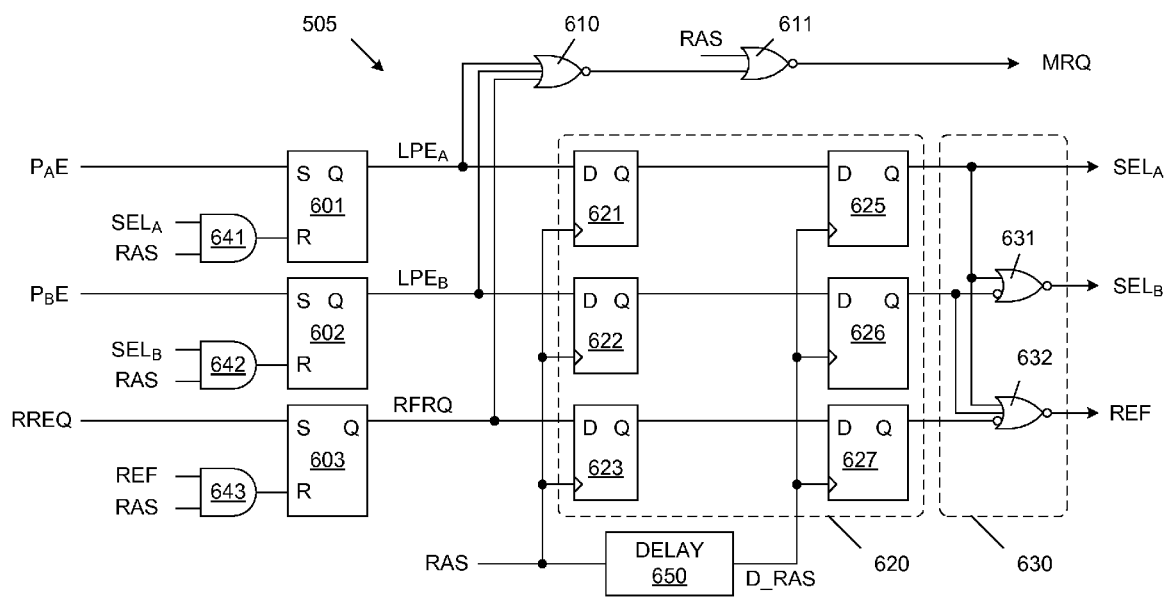
FIG. 6 is a circuit diagram of an access arbiter used in the memory system of FIG. 5 in accordance with one embodiment of the present invention.

FIG. 6 is a circuit diagram of access arbiter 505 in accordance with a first embodiment of the present invention. Access arbiter 505 includes set-reset (S-R) flip-flops 601-603, logical NOR gates 610-611, synchronizer 620, priority encoder 630, logical AND gates 641-643 and delay circuit 650. Synchronizer 620 includes first stage flip-flops 621-623 and second stage flip-flops 625-627. Priority encoder 630 includes logical NOR gates 631-632

The access request signals $P_AE$, $P_BE$ and RREQ are applied to set input terminals of S-R flip-flops 601, 602 and 603, respectively. When any one of these access request signals $P_AE$, $P_BE$, or RREQ is activated high, the corresponding S-R flip-flop 601, 602 or 603 is set to provide a logic high output signal. The latched output signals provided by S-R flip-flops 601, 602 and 603, are labeled $LPE_A$, $LPE_B$ and RFRQ, respectively. The $LPE_A$, $LPE_B$ and RFRQ signals are provided to the input terminals of NOR gate 610. If any one of the $LPE_A$, $LPE_B$ and RFRQ signals has a logic high state, NOR gate 610 provides a logic low output signal to one input terminal of NOR gate 611. The other input terminal of NOR gate 611 is coupled to receive the row access signal RAS. As long as memory array 501 is not currently being accessed (i.e., the RAS signal is de-activated low), NOR gate 611 provides a logic high memory request signal MRQ in response to the logic low output of NOR gate 610. The logic high state of the memory request signal MRQ activates memory sequencer 503 to generate the memory control signals RAS, SENSE, CAS and PRC. The activation of the RAS signal starts a memory access cycle.

Within arbiter 505, the activation of the RAS signal causes NOR gate 611 to de-activate the memory request signal MRQ to a logic low state. The RAS signal is also provided to the clock terminals of first stage flip-flops 621-623 and the input terminal of delay circuit 650. The logic high state of the RAS signal causes the $LPE_A$, $LPE_B$ and RFRQ signals to be latched into first stage flip-flops 621, 622 and 623, respectively. In addition, the logic high state of the RAS signal propagates through delay circuit 650. Delay circuit 650 is designed to have a delay time of T nanoseconds (ns). As a result, delay circuit 650 provides an output signal (D_RAS) that is delayed by T ns with respect to the RAS signal. The delayed RAS signal (D_RAS) is applied to the clock terminals of flip-flops 625-627. When the D_RAS signal transitions to a logic high state (i.e., T ns after the RAS signal is activated), the output signals provided by first stage flip-flops 621-623 are latched into second stage flip-flops 625-627, respectively, and are provided as the output signals $SEL_A$, $SEL_B$ and REF, respectively.

First stage flip-flops 621-623 and second stage flip-flops 625-627 serve as a dual-stage synchronizer for the asynchronous signals $LPE_A$, $LPE_B$ and RFRQ. The use of multi-stage flip-flops for synchronization of asynchronous events has been documented, for example, in "Digital Logic MetaStability and Flip Flop MTBF Calculation", http://www.interfacebus.com/Design_MetaStable.html and "The behavior of Flip-Flops Used as Synchronizers and Prediction of Their Failure Rate", by Harry J. M. Veendrick, JSSC vol. SC-15, No. 2, 1980, pp. 169-176. The mean-time-before-failure (MTBF) of a synchronizer is an exponential function of the delay between triggering the first stage of the synchronizer (e.g., flip-flops 621-623) and triggering the second stage of the synchronizer (e.g., flip-flops 625-627). Thus, the delay T introduced by delay circuit 650 is chosen so that the MTBF is tolerable in memory system 500.

NOR gates 631 and 632 are connected to form an access priority encoder 630, which generates the output signals $SEL_A$, $SEL_B$ and REF. If the $SEL_A$ signal (i.e., the contents of second stage flip-flop 625) is activated high, NOR gates 631 and 632 will de-activate the $SEL_B$ and REF signals, respectively, to logic low states. This effectively provides the $SEL_A$ signal with the highest priority. As described in more detail below, the logic high state of the $SEL_A$ signal enables an access operation to be performed on port A of memory system 500.

Logic AND gate 641 is configured to receive the $SEL_A$ signal and the RAS signal. During an access operation on port A, both the $SEL_A$ and RAS signals will be activated high. Under these conditions, AND gate 641 provides a logic high output signal to the reset terminal of S-R flip-flop 601. In response, S-R flip-flop 601 is reset to provide a logic low output signal $LPE_A$. As long as the next access to memory array 501 is not on port A, the logic low $LPE_A$ signal is transferred through synchronizer 660 in response to the next rising edge of the RAS signal (i.e., the next access of memory array 501), thereby returning the $SEL_A$ signal to a logic low state after the access on port A is complete. Note that if the next access to memory array 501 occurs on port A, then the $LPE_A$ signal will transition to a logic high state prior to the next rising edge of the RAS signal (thereby enabling the $SEL_A$ signal to remain activated high).

If the $SEL_A$ signal is de-activated low and the Q output of second stage flip-flop 626 is activated high, then NOR gate 631 activates the $SEL_B$ signal to a logic high state, and NOR gate 632 deactivates the REF signal to a logic low state. This effectively provides the $SEL_B$ signal with the second highest priority. As described in more detail below, the logic high state of the $SEL_B$ signal enables an access operation to be performed on port B of memory system 500.

Logic AND gate 642 is configured to receive the $SEL_B$ signal and the RAS signal. During an access operation on port B, both the $SEL_B$ and RAS signals will be activated high. Under these conditions, AND gate 642 provides a logic high output signal to the reset terminal of S-R flip-flop 602. In response, S-R flip-flop 602 is reset to provide a logic low output signal $LPE_B$. As long as the next access to memory array 501 is not on port B, the logic low $LPE_B$ signal is transferred through synchronizer 660 in response to the next rising edge of the RAS signal (i.e., the next access of memory array 501), thereby returning the $SEL_B$ signal to a logic low state after the access on port B is complete. Note that if the next access to memory array 501 occurs on port B, then the $LPE_B$ signal will transition to a logic high state prior to the next rising edge of the RAS signal.

If the $SEL_A$ signal and the Q output of second stage flip-flop 626 are both deactivated low, then NOR gate 631 provides a $SEL_B$ signal that is deactivated low. If the Q output of flip-flop 627 is activated high under these conditions, then NOR gate 632 activates the REF signal to a logic high state. This effectively provides the REF signal with the lowest priority. As described in more detail below, the logic high state of the REF signal enables a refresh operation to be performed within memory array 501.

Logic AND gate 643 is configured to receive the REF signal and the RAS signal. During a refresh access to memory array 501, both the REF and RAS signals will be activated high. Under these conditions, AND gate 643 provides a logic high output signal to the reset terminal of S-R flip-flop 603. In response, S-R flip-flop 603 is reset to provide a logic low output signal RFRQ. As long as the next access to memory array 501 is not a refresh access, the logic low RFRQ signal is transferred through synchronizer 660 in response to the next rising edge of the RAS signal (i.e., the next access of memory array 501), thereby returning the REF signal to a logic low state after the refresh access is complete. Note that if the next access to memory array 501 is a refresh access, then the RFRQ signal will transition to a logic high state prior to the next rising edge of the RAS signal.

The $SEL_A$ and $SEL_B$ signals are provided to select input terminals of 3-to-1 multiplexer 502 to select the address used to access memory array 501. As described above, the priority encoder 630 formed by NOR gates 630 and 631 allows only one of the outputs $SEL_A$, $SEL_B$ and REF to be activated at a time.

When the $SEL_A$ signal is activated high (and the $SEL_B$ and REF signals are de-activated low), multiplexer 502 routes the latched address signal $LA_A[14:0]$, the latched read write signal $LRW_A\#$ and the latched data signal $LD_A[31:0]$ associated with port A to memory array 501.

When the $SEL_B$ signal is activated high (and the $SEL_A$ and REF signals are de-activated low), multiplexer 502 routes the latched address signal $LA_B[14:0]$, the latched read write signal $LRW_B\#$ and the latched data signal $LD_B[31:0]$ associated with port B to memory array 501.

When both the $SEL_A$ and $SEL_B$ signals are deactivated low, multiplexer 502 routes the refresh address RFA[9:0] to memory array 501. Arbiter 505 routes the refresh signal REF directly to memory array 501. If the refresh signal REF is activated high (the $SEL_A$ and $SEL_B$ signals are de-activated low), then memory array 501 performs a refresh operation to the row identified by refresh address RFA[9:0]. The read/write control signal MRW# provided by multiplexer 502 is ignored when the refresh signal REF is activated.

The $SEL_A$ signal is also provided to AND gate 541 (FIG. 5), along with the pre-charge signal PRC, and the latched port A read/write signal $LRW_A\#$. In response, AND gate 541 provides the port A output enable signal $P_AO$. The port A output enable signal $P_AO$ is activated high at the end of a read access to port A (i.e., $LRW_A\#=1$ (read), $SEL_A=1$ (access to port A), PRC=1 (end of access)). The activated port A output enable signal $P_AO$ is used to latch the read data value MQ[31:0] into data output register 512.

Similarly, the $SEL_B$ signal is also provided to AND gate 542, along with the pre-charge signal PRC, and the latched port B read/write signal $LRW_B\#$. In response, AND gate 542 provides the port B output enable signal $P_BO$. The port B output enable signal $P_BO$ is activated high at the end of a read access to port B (i.e., $LRW_B\#=1$ (read), $SEL_B=1$ (access to port B), PRC=1 (end of access)). The activated port B output enable signal $P_BO$ is used to latch the read data value MQ[31:0] into data output register 522.

Figure 7:
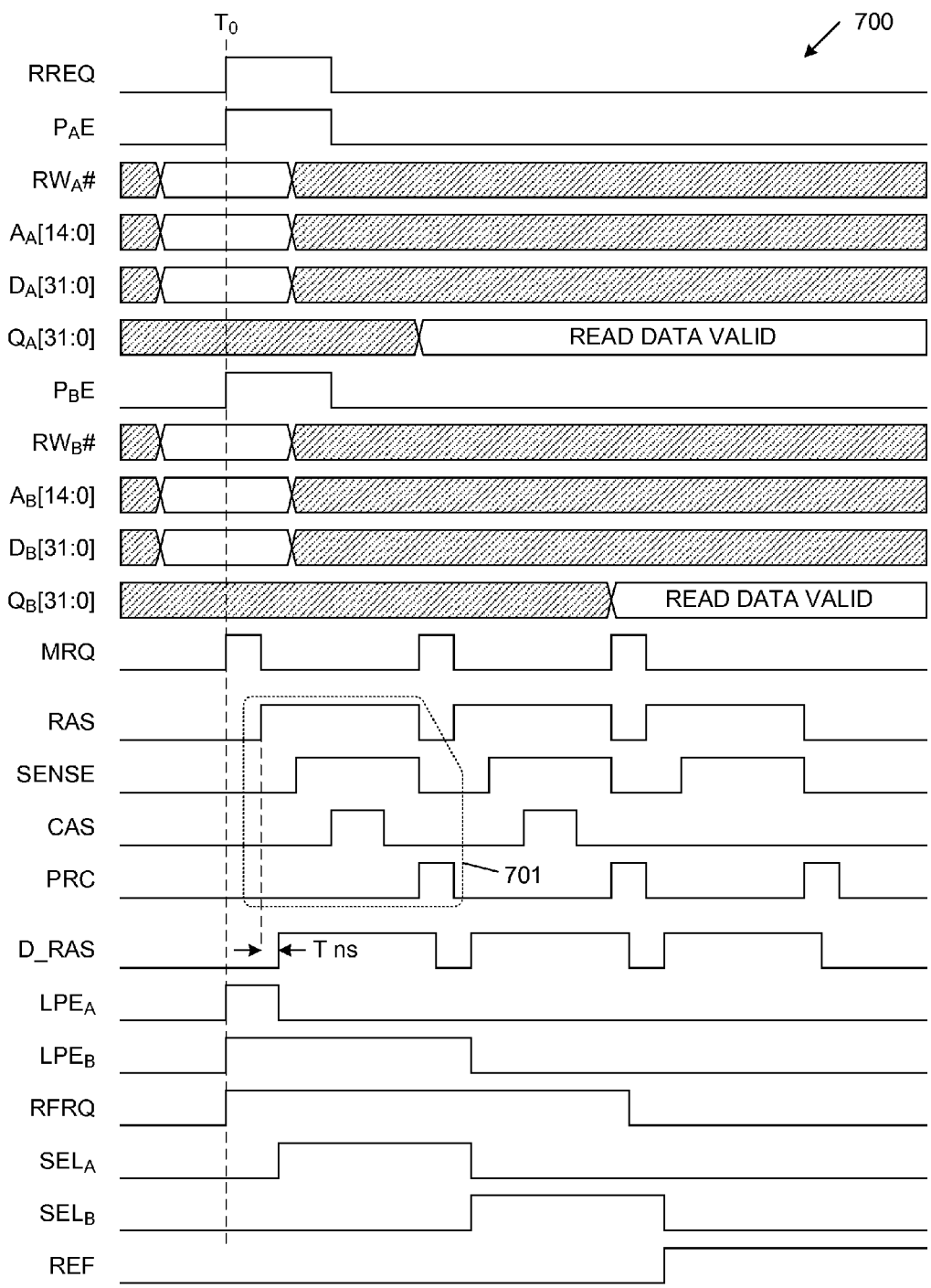
FIG. 7 is a waveform diagram illustrating worst-case operation conditions of the memory system of FIGS. 5 and 6, wherein a port A access request, a port B access request, and a refresh request occur simultaneously.

FIG. 7 is a waveform diagram 700 illustrating the signals in arbiter 505 and memory sequencer 503 for the worst case operating conditions of memory system 500, wherein access requests on ports A and B and a refresh request occur simultaneously.

Prior to time T0, an external accessing circuit (not shown) provides the read/write control signal $RW_A\#$, the address value $A_A[14:0]$ and data value $D_A[31:0]$ associated with an access on port A. Similarly, an external accessing circuit provides the read/write control signal $RW_B\#$, the address value $A_B[14:0]$ and the data value $D_B[31:0]$ associated with an access on port B. Note that data values $D_A[31:0]$ and $D_B[31:0]$ are not provided for read accesses.

At time $T_0$, refresh controller 530 activates the refresh request signal RREQ, and port enable signals $P_AE$ and $P_BE$ are activated. That is, the access request signals $P_AE$, $P_BE$, and RREQ all go high at the same time. Note that the refresh request signal RREQ, the port enable signal $P_AE$ and the port enable signal $P_BE$ are asynchronous with respect to each other. That is, there is no common clock signal controlling the activation of the RREQ, $P_AE$ and $P_BE$ signals.

Within access arbiter 505, the logic high states of the $P_AE$, $P_BE$ and RREQ signals simultaneously set S-R flip-flops 601, 602 and 603, respectively, thereby causing the corresponding latched output signals $LPE_A$, $LPE_B$ and RFRQ to transition to logic high states. In response, NOR gate 610 provides a logic low output signal, which in combination with the logic low state of the RAS signal, causes NOR gate 611 to drive the memory request signal MRQ to a logic high state. The logic high state of the memory request signal MRQ activates memory sequencer 503, such that memory sequencer 503 activates and de-activates the memory control signals (RAS, SENSE, CAS and PRC) according to the waveform pattern 701 illustrated in FIG. 7.

When the RAS signal is activated high, NOR gate 611 drives the memory request signal MRQ to a logic low state. In this manner, the RAS and MRQ signals form a handshake pair for requesting and acknowledging a memory access. Within arbiter 505, the rising edge of the RAS signal also causes first stage registers 621-623 to latch the logic high values of the $LPE_A$, $LPE_B$ and RFRQ signals, respectively.

After a delay of T ns, the rising edge of the RAS signal propagates through delay circuit 650 as the delayed signal D_RAS. The rising edge of the D_RAS signal causes second stage flip-flops 625-627 to latch the logic high values provided at the outputs of first stage flip-flops 621-623, respectively, thereby completing the synchronization between the RAS signal and the latched request signals $LPE_A$, $LPE_B$ and RFRQ. The synchronized $LPE_A$, $LPE_B$ and RFRQ signals appear at the outputs of second stage flip-flops 625-627, respectively.

The synchronized $LPE_A$ signal at the output of flip-flop 625 forms the $SEL_A$ signal. The high state of the $SEL_A$ signal causes NOR gates 631 and 632 to drive the $SEL_B$ and REF signals to logic low states. The high states of the $SEL_A$ and RAS signals cause AND gate 641 to provide a logic high output, thereby resetting the output of S-R flip-flop 601 (i.e., $LPE_A$) to a logic low state. However, the $LPE_B$ and RFRQ signals provided by S-R flip-flops 602 and 603 still have logic high states. As a result, NOR gate 610 still provides a logic low output signal to NOR gate 611.

The high state of the $SEL_A$ signal and the low states of the $SEL_B$ and REF signals cause multiplexer 502 to drive the latched memory address $LA_A[14:0]$ from address/control register 513 to memory array 501 as memory address MA[14:0]. Multiplexer 502 also drives the latched read/write control value $LRW_A\#$ to memory array 501 as memory array read/write enable signal MRW#. In addition, multiplexer 502 drives the latched input data value $LD_A[31:0]$ from data input register 511 to memory array 501 as input memory data value MD[31:0].

If the access on port A is a write operation, the read/write control signal MRW# is low, and the input memory data value MD[31:0] is written to the memory location identified by memory address MA[14:0]. If the access on port A is a read operation, the read/write control signal MRW# is high, and a read data value MQ[31:0] is retrieved from the memory location identified by memory address MA[14:0]. When the pre-charge signal PRC is activated high, the port A output enable signal $P_AO$ is activated high, thereby latching the read data value MQ[31:0] into data output register 512. The data output register 512 provides this read data value on the output data bus of port A as the output data value $Q_A[31:0]$.

The activation of the PRC signal causes the RAS signal to transition to a logic low state. Within memory sequencer 503, the logic low state of the RAS signal, coupled with the logic low signal provided by NOR gate 610, causes NOR gate 611 to drive the memory request signal MRQ to a logic high state, thereby initiating another memory access. That is, memory sequencer 503 again activates the RAS, SENSE, CAS and PRC signals in the same manner defined by waveform pattern 701. When the RAS signal is activated high, the logic low state of the $LPE_A$ signal is stored in flip-flop 621. The rising edge of the D_RAS signal subsequently causes the low state of the $LPE_A$ signal to be stored in flip-flop 625, such that this flip-flop provides a $SEL_A$ signal having a logic low state. In response, NOR gate 631 provides a $SEL_B$ signal having a logic high state, thereby causing multiplexer 502 to drive the latched memory address $LA_B[14:0]$, the latched read/write control value $LRW_B\#$ the latched input data value $LD_B[31:0]$ to memory array 501. In response, a read or write operation (as identified by the $LRW_B\#$ signal) is performed by memory array 501.

In the case of a write operation, data value $D_B[31:0]$ is written to the memory location selected by address $A_B[14:0]$. In the case of a read operation, data from the memory location associated with address $A_B[14:0]$ is driven as the output signal MQ[31:0], and is subsequently latched in output data register 522 at the rising edge of the memory pre-charge signal PRC. Output data register 522 drives the memory read data on the read data bus of port B $Q_B[31:0]$ The logic high states of the $SEL_B$ and RAS signals cause AND gate 642 to provide a logic high output, thereby resetting the output of S-R flip-flop 602 (i.e., $LPE_B$) to a logic low state. However, the RFRQ signal provided by S-R flip-flop 603 still has a logic high state. Thus, NOR gate 610 continues to provide a logic low output signal to NOR gate 611.

When the RAS signal is de-activated low at the end of the access, NOR gate 611 in arbiter 505 again drives the MRQ signal to a logic high state, thereby requesting another memory access (i.e., a refresh access). In response, memory sequencer 503 drives RAS, SENSE and PRC signals in accordance with the waveform pattern 701. The rising edges of the RAS and D_RAS signals cause the logic low state of the $LPE_B$ signal to be transmitted through flip-flops 622 and 626, respectively. In response, NOR gate 631 provides a logic low $SEL_B$ signal and NOR gate 632 provides a logic high REF signal. The high state of the REF signal designates the current memory cycle a refresh access.

The logic low states of the $SEL_A$ and $SEL_B$ signals cause multiplexer 502 to route the refresh row address RFA[9:0] from refresh controller 530 to memory array 501 as the address signal MA[14:5]. The high state of the REF signal suppresses the generation of the column access signal CAS in the memory sequencer, since there is no column access in a refresh operation. The high state of REF signal also inhibits any read or write operation in memory array 501. Within arbiter 505, the logic high states of the REF and RAS signals cause AND gate 643 to provide a logic high output, thereby resetting the RFRQ signal provided by S-R flip-flop 603 to a logic low state. When the pre-charge signal transitions to a logic high state and the RAS signal transitions to a logic low state, memory system 500 is ready to accept another access request.

Figure 8:
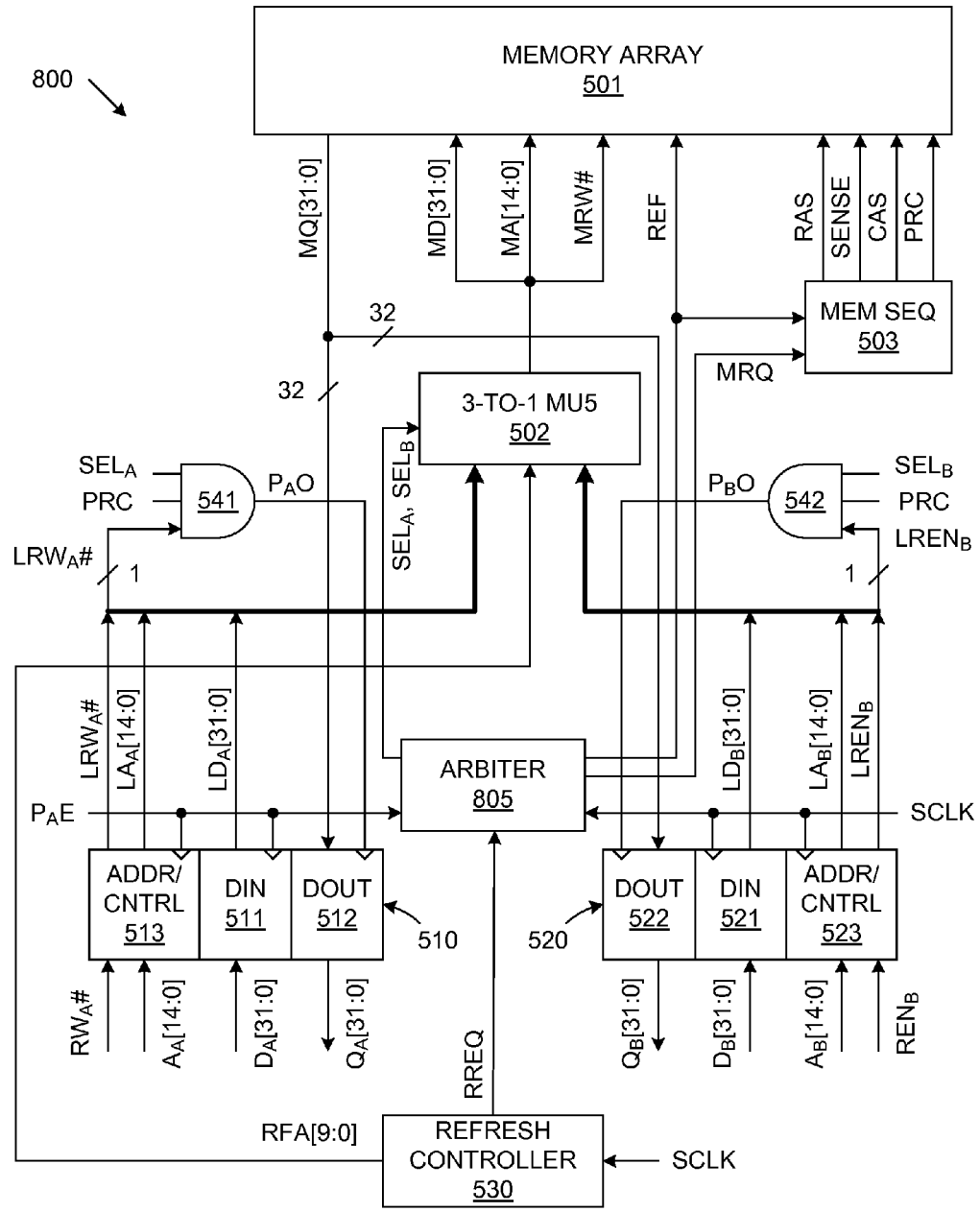
FIG. 8 is a block diagram of a dual-port memory system, which is implemented using single-port memory cells in accordance with an alternate embodiment of the present invention.

FIG. 8 is a block diagram of a dual-port memory system 800, which is implemented using single-port memory cells in accordance with an alternate embodiment of the present invention. Because dual-port memory system 800 is similar to dual-port memory system 500, similar elements in FIGS. 8 and 5 are labeled with similar reference numbers. Within dual-port memory system 800, port B is a read-only port. In addition, the port enable signal $P_BE$ of memory system 500 is replaced with a clock signal SCLK, and the read/write signal $RW_B\#$ of memory system 500 is replaced with a read enable signal $REN_B$ in dual-port memory system 800. Thus, dual-port memory system 800 includes an access arbiter 805 which operates in a different manner than the access arbiter 505 of dual-port memory system 500.

Figure 9:
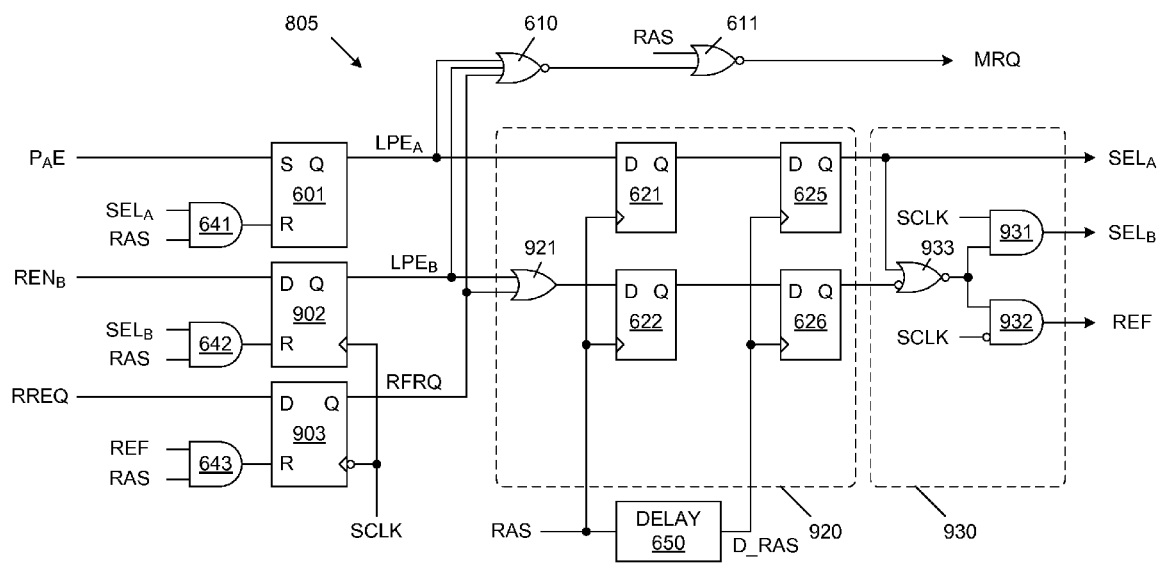
FIG. 9 is a circuit diagram of an access arbiter for use in the memory system of FIG. 8, in accordance with one embodiment of the present invention.

FIG. 9 is a circuit diagram of access arbiter 805 in accordance with one embodiment of the present invention. Access arbiter 805 includes S-R flip-flop 601, data flip-flops 902-903, NOR gates 610-611, synchronizer 920, priority encoder 930, AND gates 641-643 and delay circuit 650. Synchronizer 920 includes OR gate 921, first stage flip-flops 621-622 and second stage flip-flops 625-626. S-R flip-flop 601, NOR gates 610-611, first stage flip-flops 621-622, second stage flip-flops 625-626, delay circuit 650 and logical AND gates 641-643 have been described above in connection with access arbiter 605 (FIG. 6). Priority encoder 930 includes logical AND gates 931-932 and NOR gate 933.

The data (D) input terminals of flip-flops 902-903 are coupled to receive the port B read enable signal $REN_B$ and the refresh request signal RREQ, respectively. The reset (R) terminals of flip-flops 902-903 are coupled to receive the output signals provided by AND gates 642 and 643, respectively. Flip-flops 902 and 903 include a clock input terminal and an inverting clock input terminal, respectively, which are coupled to receive the SCLK signal. Flip-flops 601, 902 and 903 provide latched access enable signals $LPE_A$, $LPE_B$ and RFRQ, respectively, to NOR gate 610. NOR gate 610 is coupled to NOR gate 611, which generates the MRQ signal in the manner described above in connection with FIG. 6. The $LPE_B$ and RFRQ signals are also provided to OR gate 921 within synchronizer 920. If either the $LPE_B$ signal or the RFRQ signal has a logic high state, then a logic high signal is provided to the D input terminal of first stage flip-flop 622. Otherwise, a logic low signal is provided to the D input terminal of first stage flip-flop 622. First stage flip-flops 621 and 622 are clocked by the RAS signal, and second stage flip-flops 625 and 626 are clocked by the D_RAS signal provided by delay circuit 650.

The port A select signal $SEL_A$ is provided at the output of second stage flip-flop 625. NOR gate 933 has a non-inverting terminal coupled to receive the $SEL_A$ signal, and an inverting input terminal coupled to receive the Q output signal of second stage flip-flop 626. In response, NOR gate 933 provides an output signal to AND gates 931 and 932. The other input terminal of AND gate 931 is coupled to receive the SCLK signal, and the other input terminal of AND gate 932 is coupled to receive the inverse of the SCLK signal. In response, AND gates 931 and 932 provide the $SEL_B$ and REF signals, respectively. In general, the $SEL_B$ and REF signals are deactivated low if the $SEL_A$ signal is activated high. If the $SEL_A$ signal is de-activated low, then the $SEL_B$ and REF signals can be activated high during alternate half cycles of the SCLK signal.

In accordance with one embodiment, access arbiter 805 is used to implement a display buffer, wherein port A is used by a graphics controller to implement a screen update function, and port B is used to implement a screen refresh function. Port A (i.e., the screen update port) is a read-write port, which has priority over port B (i.e., the screen refresh port) and the refresh mechanism. Port A operates in a manner similar to that described above in connection with FIGS. 6-7. That is, when the port enable signal $P_AE$ is activated high, the latched port enable signal $LPE_A$ and the memory request signal MRQ are both activated high. The RAS signal is activated in response to the activated MRQ signal. The delayed RAS signals D_RAS is activated in response to the activated RAS signal. The $SEL_A$ signal is then activated in a synchronized manner in response to the RAS and D_RAS signals. The activated $SEL_A$ and RAS signals reset S-R flip-flop 601 prior to the next access on port A.

The screen refresh operation is performed on port B on a regular basis, and is synchronized using the SCLK signal. The port B enable signal $REN_B$ is activated high to indicate that a read transaction is arriving at screen refresh port B. The continuously running SCLK signal is also input to refresh controller 530 to generate the refresh request signal RREQ, as well as the refresh address RFA[9:0]. With this arrangement, the refresh request signal RREQ is synchronous with the SCLK signal, such that refresh requests and read requests from port B are synchronous with respect to each other. In accordance with one embodiment, the refresh requests are controlled to occur while the SCLK signal has a logic low state, and read requests from port B are controlled to occur while the SCLK signal has a logic high state (or vice versa), thereby eliminating the need to arbitrate between read accesses on port B and refresh accesses. Using this configuration simplifies access arbiter 805 (with respect to access arbiter 505) by reducing the required number of synchronizers from three to two.

Returning now to FIG. 9, the read request signal $REN_B$ and the refresh request signal RREQ are latched by data flip-flops 902 and 903, respectively, at the rising and falling edges of the SCLK signal. The latched memory request signals $LPE_A$, $LPE_B$ and RFRQ are logically OR'ed to generate the memory request signal MRQ. Because the latched access request signal $LPE_B$ and the latched refresh request signal RFRQ are synchronous signals, OR gate 921 performs a logical OR function on these signals prior to synchronization with the RAS signal.

Synchronization is carried out by the multi-stage synchronizer formed by data registers 622 and 626. NOR gate 933 provides access priority to port A, such that the $SEL_B$ and REF signals are deactivated low if the $SEL_A$ signal is activated high. AND gates 931-932 (along with the SCLK signal) resolve the access priority between a read access to port B and a refresh access. When the output of NOR gate 933 has a logic high state and the SCLK signal has a logic high state, a read access is performed on port B. When the output of NOR gate 933 has a logic high state and the SCLK signal has a logic low state, a refresh access is performed within memory array 501.

Even though three multi-stage synchronizers are used in access arbiter 505, and two multi-stage synchronizers are used in access arbiter 805, only two signals need to be synchronized in arbiter 505, and only one signal needs to be synchronized in arbiter 805. This is because the RAS signal is activated by the MRQ signal, which in turn is activated by the high state of at least one of the $LPE_A$, $LPE_B$ or RFRQ signals. Each path of the synchronizer can readily resolve those signals ($LPE_A$, $LPE_B$ or RFRQ) activated before the activation of the RAS signal and having sufficient setup time at the first stage flip-flop. Such signals are considered synchronized with the RAS signal. Thus, the RAS signal is synchronized with at least one of the three requests signals ($LPE_A$, $LPE_B$ or RFRQ) every time the RAS signal is activated. The net MTBF of the all the synchronizer paths is equal to the number of signals that need to be synchronous, times the MTFB of a single synchronizer path. Therefore, the net MTBF of arbiter 805 is twice as long as the net MTBF of arbiter 505. This is the result of using the continuous SCLK signal to generate both the refresh request signal RREQ and the port B read access enable signal $REN_B$, such that refresh accesses and port B read accesses are synchronous, thereby eliminating one signal that needs to be synchronized.

Although the present invention has been described in connection with several embodiments, it is understood that this invention is not limited to the embodiments disclosed, but is capable of various modifications and embodiments which would be apparent to one of ordinary skill in the art. For example, although the disclosed embodiments have concentrated on a memory system that implements single-port DRAM cells, with minor modifications by ordinary skill memory designers, the present invention can be practiced using single-port SRAM cells. When using single-port memory cells that do not require periodic refresh, refresh controller 530 can be eliminated, and the refresh request signal RREQ can be grounded. It is, therefore, contemplated that the appended claims will cover any such modifications or embodiments as falling within the true scope of the invention.

I claim:

1. A semiconductor memory system comprising:
   a memory array comprising a plurality of single-port memory cells;
   two access ports, including a first port and a second port; and
   an access arbiter configured to arbitrate synchronous or asynchronous access requests on the first and second ports by synchronizing and prioritizing these access requests.

2. The semiconductor memory system of claim 1, wherein the access arbiter comprises a synchronizer circuit having a first stage clocked by a memory access control signal used to initiate an access of the memory array, and a second stage clocked by a delayed version of the memory access control signal.

3. The semiconductor memory system of claim 2, further comprising a delay circuit configured to introduce a delay to the memory access control signal, thereby creating the delayed version of the memory access control signal.

4. The semiconductor memory system of claim 2, further comprising a multiplexer coupled to the first port and the second port, wherein the multiplexer is configured to selectively route signals from the first port or the second port to the memory array in response to signals provided by the second stage of the synchronizer circuit.

5. The semiconductor memory system of claim 1, further comprising a multiplexer coupled to the first port and the second port, wherein the multiplexer is configured to selectively route signals from the first port or the second port to the memory array in response select signals generated by the access arbiter.

6. The semiconductor memory system of claim 1, further comprising a memory sequencer configured to sequentially activate and deactivate a plurality of control signals for accessing the memory array in response to a memory request signal provided by the access arbiter.

7. The semiconductor memory system of claim 1, wherein the single-port memory cells require refreshing, the semiconductor memory system further comprising a refresh controller configured to activate a refresh request signal, which is provided to the access arbiter.

8. The semiconductor memory system of claim 7, wherein the second port is a read-only port enabled in response to a clock signal, and wherein the refresh controller is configured to activate the refresh request signal in response to the clock signal.

9. The semiconductor memory system of claim 8, wherein the first port is an asynchronous read-write port.

10. The semiconductor memory system of claim 7, wherein the access arbiter is further configured to arbitrate refresh requests indicated by the activated refresh request signal.

11. The semiconductor memory system of claim 7, wherein the access requests on the first and second ports and the refresh request signal are asynchronous with respect to one another.

12. The semiconductor memory system of claim 1, wherein the first and second ports are asynchronous read-write ports.

13. A method of operating a memory system comprising:
    storing data in single-port memory cells of a memory array;
    accessing the memory array in response to access requests on a first port;
    accessing the memory array in response to access requests on a second port; and
    arbitrating asynchronous access requests on the first and second ports by synchronizing and prioritizing these access requests.

14. The method of claim 13, wherein the access requests on the first and second ports are synchronized by:
    storing the access requests on the first and second ports in first stage registers in response to a memory access control signal used to initiate an access of the memory array; and
    storing the access requests in the first stage registers in second stage registers in response to a delayed version of the memory access control signal.

15. The method of claim 14, further comprising introducing a delay to the memory access control signal, thereby creating the delayed version of the memory access control signal.

16. The method of claim 14, further comprising selectively routing access control signals from the first port or the second port to the memory array in response to signals provided by the second stage of the synchronizer circuit.

17. The method of claim 13, wherein the step of arbitrating comprises activating a memory request signal to indicate a granted access request, the method further comprising sequentially activating and deactivating a plurality of control signals for accessing the memory array in response to the activated memory request signal.

18. The method of claim 13, further comprising periodically refreshing the single-port memory cells.

19. The method of claim 18, further comprising:
    performing only read accesses to the second port, wherein the access requests on the second port are provided by a clock signal; and
    generating refresh requests for the single-port memory cells in response to the clock signal.

20. The method of claim 19, further comprising performing read and write accesses on the first port in an asynchronous manner with respect to the clock signal.

21. The method of claim 19, further comprising arbitrating the refresh requests with the access requests on the first and second ports.

* * * * *